United States Patent
Campbell et al.

(10) Patent No.: US 6,881,623 B2
(45) Date of Patent: *Apr. 19, 2005

(54) METHOD OF FORMING CHALCOGENIDE COMPRISING DEVICES, METHOD OF FORMING A PROGRAMMABLE MEMORY CELL OF MEMORY CIRCUITRY, AND A CHALCOGENIDE COMPRISING DEVICE

(75) Inventors: Kristy A. Campbell, Boise, ID (US); John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 196 days.

This patent is subject to a terminal disclaimer.

(21) Appl. No.: 09/943,190

(22) Filed: Aug. 29, 2001

(65) Prior Publication Data

US 2003/0045054 A1 Mar. 6, 2003

(51) Int. Cl.$^7$ .............................................. H01L 21/336
(52) U.S. Cl. ........................ 438/257; 365/129; 365/132; 365/135; 365/140; 365/170; 365/180; 365/188
(58) Field of Search ................................. 365/129, 130, 365/131, 132–190; 438/257

(56) References Cited

U.S. PATENT DOCUMENTS

| | | | |
|---|---|---|---|
| 3,622,319 A | 11/1971 | Sharp | |
| 3,743,847 A | 7/1973 | Boland | |
| 4,115,872 A | 9/1978 | Bluhm | |
| 4,177,475 A | 12/1979 | Holmberg | |
| 4,203,123 A | 5/1980 | Shanks | |

(Continued)

FOREIGN PATENT DOCUMENTS

| | | |
|---|---|---|
| JP | 56126916 A | 10/1981 |
| WO | WO 97/48032 | 12/1997 |
| WO | WO 99/28914 | 6/1999 |
| WO | 00/48196 A1 | 8/2000 |
| WO | 02/21542 A1 | 3/2002 |

OTHER PUBLICATIONS

D.B. Johnson, et al., "Lateral Diffusion in Ag–Be Thin–Film Couples", Journal of Applied Physics, vol. 40, No. 1, Jan. 1963, pp. 149–152.
U.S. Appl. No. 09/797,635, filed Mar. 1, 2001, Moore.
U.S. Appl. No. 09/732,968, filed Dec,6, 2000, Cohen.
U.S. Appl. No. 09/943,999, filed Aug. 29, 2001, Campbell, et al.
U.S. Appl. No. 09/943,187, filed Aug. 29, 2001, Campbell, et al.
U.S. Appl. No. 09/778,963, filed Feb. 8, 2001, Moore.

(Continued)

*Primary Examiner*—Matthew Smith
*Assistant Examiner*—Renzo N. Rocchegiani
(74) *Attorney, Agent, or Firm*—Dickstein Shapiro Morin & Oshinsky LLP

(57) ABSTRACT

A chalcogenide material is formed to a first thickness over the first conductive electrode material. The chalcogenide material includes $A_xB_y$. A layer that includes a metal is formed to a second thickness over the chalcogenide material. The metal including layer defines some metal including layer transition thickness for the first thickness of the chalcogenide material such that when said transition thickness is met or exceeded, said metal including layer when diffused within said chalcogenide material transforms said chalcogenide material from an amorphous state to a crystalline state. The second thickness being less than but not within 10% of said transition thickness. The metal including layer is irradiated effective to break a chalcogenide bond of the chalcogenide material and diffuse at least some of the metal into the chalcogenide material.

28 Claims, 3 Drawing Sheets

U.S. PATENT DOCUMENTS

| | | | |
|---|---|---|---|
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | 430/311 |
| 4,419,421 A | 12/1983 | Wichelhaus et al. | 429/191 |
| 4,499,557 A | 2/1985 | Holmberg et al. | 365/163 |
| 4,653,024 A | 3/1987 | Young et al. | |
| 4,671,618 A | 6/1987 | Wu et al. | |
| 4,795,657 A | 1/1989 | Formigoni et al. | |
| 4,800,526 A | 1/1989 | Lewis | |
| 4,847,674 A | 7/1989 | Sliwa et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,314,772 A | 5/1994 | Kozicki | |
| 5,315,131 A | 5/1994 | Kishimoto et al. | 257/57 |
| 5,350,484 A | 9/1994 | Gardner et al. | 156/628 |
| 5,360,981 A | 11/1994 | Owen et al. | |
| 5,363,329 A | 11/1994 | Troyan | |
| 5,500,532 A | 3/1996 | Kozicki | |
| 5,512,328 A | 4/1996 | Yoshimura et al. | 427/498 |
| 5,512,773 A | 4/1996 | Wolf et al. | 257/471 |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,841,150 A | 11/1998 | Gonzalez et al. | |
| 5,846,889 A | 12/1998 | Harbison et al. | 401/40 |
| 5,896,312 A | 4/1999 | Kozicki et al. | |
| 5,914,893 A | 6/1999 | Kozicki et al. | |
| 5,920,788 A | 7/1999 | Reinberg | |
| 5,998,066 A | 12/1999 | Block et al. | |
| 6,072,716 A | 6/2000 | Jacobson et al. | |
| 6,077,729 A | 6/2000 | Harshfield | |
| 6,084,796 A | 7/2000 | Kozicki et al. | |
| 6,117,720 A | 9/2000 | Harshfield | 438/238 |
| 6,143,604 A | 11/2000 | Chiang et al. | 438/253 |
| 6,177,338 B1 | 1/2001 | Liaw et al. | 438/629 |
| 6,236,059 B1 | 5/2001 | Wolstenholme et al. | |
| 6,274,805 B1 * | 8/2001 | Nakazawa et al. | 136/256 |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,348,365 B1 | 2/2002 | Moore et al. | |
| 6,350,679 B1 | 2/2002 | McDaniel et al. | 438/634 |
| 6,376,284 B1 | 4/2002 | Gonzalez et al. | |
| 6,388,324 B1 | 5/2002 | Kozicki | |
| 6,391,688 B1 | 5/2002 | Gonzalez et al. | |
| 6,414,376 B1 | 7/2002 | Thakur et al. | |
| 6,418,049 B1 | 7/2002 | Kozicki et al. | |
| 6,423,628 B1 | 7/2002 | Li et al. | |
| 6,469,364 B1 | 10/2002 | Kozicki | |
| 6,473,332 B1 | 10/2002 | Ignatiev et al. | |
| 6,487,106 B1 | 11/2002 | Kozicki | |
| 6,638,820 B1 * | 10/2003 | Moore | 438/256 |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 * | 9/2002 | Li | 438/237 |
| 2002/0160551 A1 | 10/2002 | Harshfield | |
| 2002/0163828 A1 | 11/2002 | Krieger et al. | |
| 2002/0168820 A1 | 11/2002 | Kozicki et al. | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 * | 3/2003 | Campbell et al. | 438/237 |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0049912 A1 * | 3/2003 | Campbell et al. | 438/385 |
| 2003/0068861 A1 | 4/2003 | Li | |
| 2003/0068803 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2004/0038480 A1 | 2/2004 | Moore et al. | |
| 2004/0042259 A1 | 3/2004 | Campbell et al. | |
| 2004/0053461 A1 | 3/2004 | Moore et al. | |

OTHER PUBLICATIONS

Hirose, et al., "High Memory Behavior and Reliability in Amorphous $As_1S_0$ Film Doped with Ag", Jul. 17, 1980, pp. K187–K190.

Hirose, et al., "Polarity–dependent memory switching and behavior of Ag dendrite in Ag–photodoped amorphous $As_1B_1$ films", Journal of Applied Physics, vol. 47, No. 6, Jun. 1976, pp. 2787–2772.

Kawaguchi, et al., "Optical, electrical, and structural properties of amorphous Ag–Ge–S and Ag–Ge–Se films and comparison of photoinduced and thermally induced phenomena of both systems", Journal of Applied Physics, 79, Jun. 1996, pp. 9096–9104.

Kluge, et al., "Silver photodifusion in amorphous $Ga_1Se_1$", Journal of Non–Crystalline Solids 124 (1990) pp. 180–183.

Kolobov, A.V., "Photodoping of amorphous chalcogenides by metals", Advances in Physics, 1991, vol. 40, No. 5, pp. 625–634.

Mitikova, et al. "Dual Chemical Role of Ag as an Additive in Chalcogenide Glasses", Physical Review Letters, Vo.. 83, No. 19, pp. 3848–3851.

Mitikova, "Insulating and Semiconducting Glasses", Editor, P. Boolchand, World Scientific, New Jersey, 2000, pp. 813–843.

Aron Technologies Corporation, Technology Description: *Programmable Metallization Cell (PMC)*, (pre–Jul. 7, 2000) pp. 1–5.

Shimakawa et al., *Photoinduced effects and metastability in amorphous semiconductors and insulators*, 44 Advanced in Physics No. 6, 475–588 (Taylor & Francis Ltd. 1995).

U.S. Appl. No. 09/921,518, filed Aug. 1, 2001, Moore, (as filed and as amended).
U.S. Appl. No. 09/999,883, filed Mar. 1, 2001, Moore, (as filed).
U.S. Appl. No. 10/061,825, filed Jan. 31, 2002, Gilton et al., (as filed).
Abdel–All, A.; Elshafie,A.; Elhawary, M.M., DC electric–field effect in bulk and thin–film Ge5As38Te57 chalcogenide glass, Vacuum 59 (2000) 845–853.
Adler, D.; Moss, S.C., Amorphous memories and bistable switches, J. Vac. Sci. Technol. 9 (1972) 1182–1189.
Adler, D.; Henisch, H.K.; Mott, S.N., The mechanism of threshold switching in amorphous alloys, Rev. Mod. Phys. 50 (1978) 209–220.
Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.
Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.
Alekperova, Sh.M.; Gadzhieva, G.S., Current–Voltage characteristics of Ag2Se single crystal near the phase transition, Inorganic Materials 23 (1987) 137–139.
Aleksiejunas, A.; Cesnys, A., Switching phenomenon and memory effect in thin–film heterojunction of polycrystalline selenium–silver selenide, Phys. Stat. Sol. (a) 19 (1973) K169–K171.
Angell, C.A., Mobile ions in amorphous solids, Annu. Rev. Phys. Chem. 43 (1992) 693–717.
Aniya, M., Average electronegativity, medium–range–order, and ionic conductivity in superionic glasses, Solid state Ionics 136–137 (2000) 1085–1089.
Asahara, Y.; Izumitani, T., Voltage controlled switching in Cu–As–Se compositions, J. Non Cryst. Solids 11 (1972) 97–104.
Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.
Baranovskii, S.D.; Cordes, H., On the conduction mechanism in ionic glasses, J. Chem. Phys. 111 (1999) 7546–7557.
Belin, R.; Taillades, G.; Pradel, A.; Ribes, M., Ion dynamics in superionic chalcogenide glasses: complete conductivity spectra, Solid state Ionics 136–137 (2000) 1025–1029.
Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.
Benmore, C.J.; Salmon, P.S., Structure of fast ion conducting and semiconducting glassy chalcogenide alloys, Phys. Rev. Lett. 73 (1994) 264–267.
Bernede, J.C., Influence du metal des electrodes sur les caracteristiques courant–tension des structures M–Ag2Se–M, Thin solid films 70 (1980) L1–L4.
Bernede, J.C., Polarized memory switching in MIS thin films, Thin Solid Films 81 (1981) 155–160.
Bernede, J.C., Switching and silver movements in Ag2Se thin films, Phys. Stat. Sol. (a) 57 (1980) K101–K104.
Bernede, J.C.; Abachi, T., Differential negative resistance in metal/insulator/metal structures with an upper bilayer electrode, Thin solid films 131 (1985) L61–L64.
Bernede, J.C.; Conan, A.; Fousenan't, E.; El Bouchairi, B.; Goureaux, G., Polarized memory switching effects in Ag2Se/Se/M thin film sandwitches, Thin solid films 97 (1982) 165–171.

Bermede, J.C.; Khelil, A.; Kettaf, M.; Conan, A., Transition from S– to N–type differential negative resistance in Al–Al203–Ag2–xSe1+x thin film structures, Phys. Stat. Sol. (a) 74 (1982) 217–224.
Bondarev, V.N; Pikhitsa, P.V., A dendrite model of current instability in RbAg4I5, Solid State Ionics 70/71 (1994) 72–76.
Boolchand, P., The maximum in glass transition temperature (Tg) near x=$\frac{1}{3}$ in GexSe1–x.
Glasses, Asian Journal of Physics (2000) 9, 709–72.
Boolchand, P.; Bresser, W.J., Mobile silver ions and glass formation in solid electrolytes, Nature 410 (2001) 1070–1073.
Boolchand, P.; Georgiev, D.G.; Goodman, B., Discovery of the Intermediate Phase in Chalcogenide Glasses, J. Optoelectronics and Advanced Materials, 3 (2001), 703.
Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thrope and Tichy, L. (eds.) Kluwer Academic Publishers, the Netherlands, 2001, pp. 97–132.
Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.
Boolchand, P.; Grothaus, J.; Bresser, W.J.; Suranyi, P., Structural origin of broken chemical order in a GeSe2 glass, Phys. Rev. B 25 (1982) 2975–2978.
Boolchand, P.; Grothaus, J.; Phillips, J.C., Broken chemical order and phase separation in GexSe1–x glasses, Solid state comm. 45 (1983) 183–185.
Boolchand, P., Bresser, W.J.., Compositional trends in glass transition temperature (Tg), network connectivity and nanoscale chemical phase separation in chalcogenides, Dept. of ECECS, Univ. Cincinnati (Oct. 28, 1999) 45221–0030.
Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.
Bresser, W.; Boolchand, P.; Suranyi, P., Rigidity percolation and molecular clustering in network glasses, Phys. Rev. Lett. 56 (1986) 2493–2496.
Bresser, W.J.; Boolchand, P.; Suranyi, P.; de Neufville, J.P, Intrinsically broken chalcogen chemical order in stoichiometric glasses, Journal de Physique 42 (1981) C4–192–C4–196.
Bresser, W.J.; Boolchand, P.; Suranyi, P.; Hernandez, J.G., Molecular phase separation and cluster size in GeSe2 glass, Hyperfine Interactions 27 (1986) 389–392.
Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.
Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.
Chen, C.H.; Tai, K.L. , Whisker growth induced by Ag photodoping in glassy GexSe1–x films, Appl. Phys. Lett. 37 (1980) 1075–1077.
Chen, G.; Chen, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Deamaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous.

silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahia, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammand, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:/H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan, J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kolobov, A.V., On the origin of p–type conductivity in amorphous chalcogenides, J. Non–Cryst. Soldis 198–2000 (1996) 728–731.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTL chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contracts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185 –C2–188.

Messoussi, R.; Bernede, J.C.; Benhida, S.; Abachi, T.; Latef, A., Electrical characterization of M/Se structures (m=Ni,Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imagi, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky, S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.; Hajto, J.; Lecomber, P.G.; Gage, S.M.; Choi, W.K.; Snell, A.J.; Owen, A.E., Amorphous silicon analogue memory devices, J. Non–Cryst. Solids 115 (1989) 168–170.

Rose, M.J.; Snell, A.J.; Lecomber, P.G.; Hajto, J.; Fitzgerald, A.G.; Owen, A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.; Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M.; Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant, S.; Peytavin, S.; Ribes, M.; Flank, A.M.; Dexpert, H.; Lagarde, J.P., Silver chalcogenide glasses Ag–Ge–Se: Ionic conduction and exafs structural investigation, Transport–structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behavior of amorphous selenium films, J. Non–Cryst. Solids 33 (1976) 267–272.

Vodenicharov, C.; Parvanov, S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

Zhang, M.; Mancini, S.; Bresser, W.; Boolchand, P., Variation of glass transition temperature, Tg, with average coordination number <m>, in network glasses: evidence of a threshold behavior in the slope |dTg/d<m>| at the rigidity percolation threshold (<m>=2.4), J. Non–Cryst. Solids 151 (1992) 149–154.

Das et al., *Theory of the characteristic curves of the silver chalcogenide glass inorganic photoresists,* 54 Appl. Phys. Lett., No. 18, pp. 1745–1747 (May 1989).

Helbert et al., *Intralevel hybrid resist process with submicron capability,* SPIE vol. 333 Submicron Lithography pp. 24–29 (1982).

Hilt, Disserttion: *Materials Characterization of Silver Chalcogenide Programmable Metallization Cells,* Arizona State University, pp. title p.–114 (UMI Company, May 1999).

Holmquist et al., *Reaction and Diffusion in Silver–Arsenic Chalcogenide Glass Systems,* 62 J. Amer. Ceramic Soc., Nos. 3–4, pp. 183–188 (Mar.–Apr. 1979).

Huggett et al., *Development of silver sensitized germanium selenide photoresist by reactive sputter etching in SF*, 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234. (1993).

McHardy et al., *The dissolution of metals in amorphous chalcogenides and the effects of electron and ultraviolet radiation*, 20 J. Phys. C: Solid State Phys., pp. 4055–4075 (1987).

Miyatani, *Electrical Porperties of $Ag_2Se_1$* 13 J. Phys. Soc. Japan, p. 317–(1958).

Mizusaki et al. *Kinetic Studies on the Selenization of Silver*, 47 Bul. Chem. Soc. Japan,. No. 11 pp. 2851–2855 (Nov. 1974).

Owens et al., *Metal–Chalcogenide Photoresists for High Resolution Lithography and Sub–Micron Structures*, Nanostructure Physics and Fabrication, pp. 447–451 (Academic Press, 1989).

Safran et al., *TEM study of $Ag_2Se$ developed by the reaction of polycrystalline silver films and seleneium*, 317 Thin Solid Films, pp. 72–76 (1998).

Shimizu et al., *The Photo–Erasable Memory Switching Effect of Ag Photo–Doped Chalcogenide Glasses*, 46 Bul. Chem. Soc. Japan, No. 12, pp. 3662–3665 (Dec. 1973).

Somogyi et al., *Temperature Dependence of the Carrier Mobility in $Ag_2Se$ Layers Grown on* NaCl *and* $SiO_x$ *Substrates*, 74 Acta Physica Hungarica, No. 3, pp. 243–255 (1994).

Tai et al., *Multilevel Ge–Se film based resist systems*, SPIE vol. 333 Submicron Lithography, pp. 32–39 (Mar. 1982).

Tai et al., *Submicron optical lithography using an inorganic resist/polymer bilevel scheme* 17 J. Vac. Sci. Technol., No. 5, pp. 1169–1176 (Sep./Oct. 1980).

West, Dissertation: *Electrically Erasable Non–Volatile Memory Via electrochemical Deposition of Multifractal Aggregates*, Arizona State University, pp. title p.–168 (UMI Co., May 1998).

West et al., *Equivalent Circuit Modeling of the $Ag|As_{0-24}S_{0.24}Ag_{\alpha 40}|Ag$ System Prepared by Photodissolution of Ag*, 145 J. Electrochem. Soc., No. 9, pp. 2971–2974 (Sep. 1998).

Yoshikawa et al., *A new inorganic electron resist of high contrast*, 31 Appl. Phys. Lett., No. 3, pp. 161–163 (Aug. 1977).

Yoshikawa et al., *Dry development of Se–Ge inorganic photoresist*, 36 Appl. Phys. Lett., No. 1, pp. 107–109 (Jan. 1980).

Kozicki, et al., "Applications of Programmable Resistance Changes in Metal–doped Chalcogenides", Proceedings of the 1999 Symposium on Solid State Ionic Devices, Editors –E.D. Wachsman et al., The Electrochemical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineering, vol. 63/1–3,155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

* cited by examiner

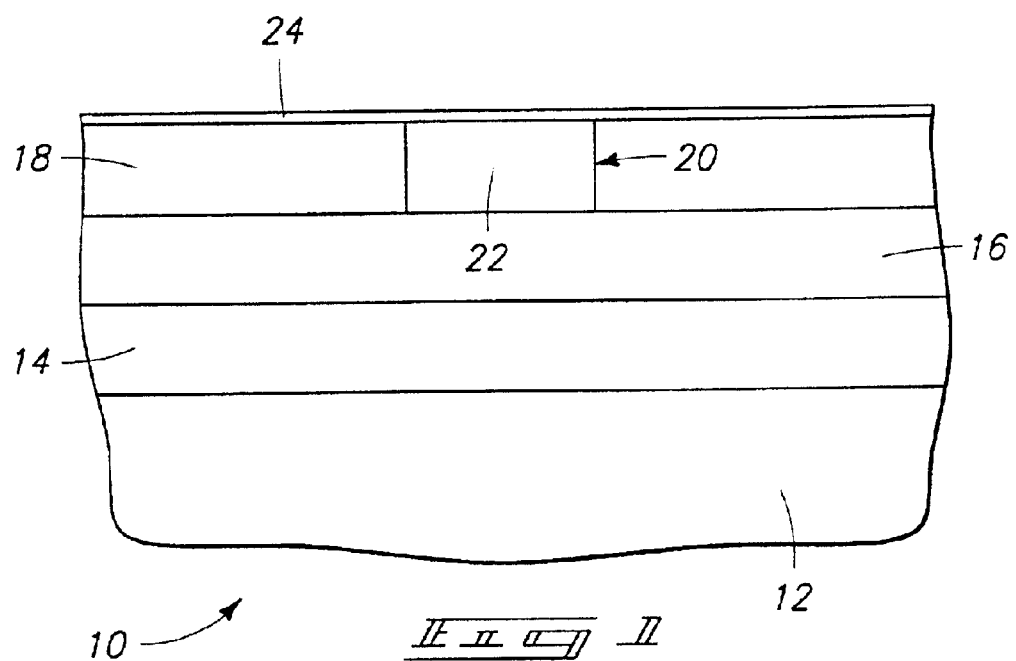
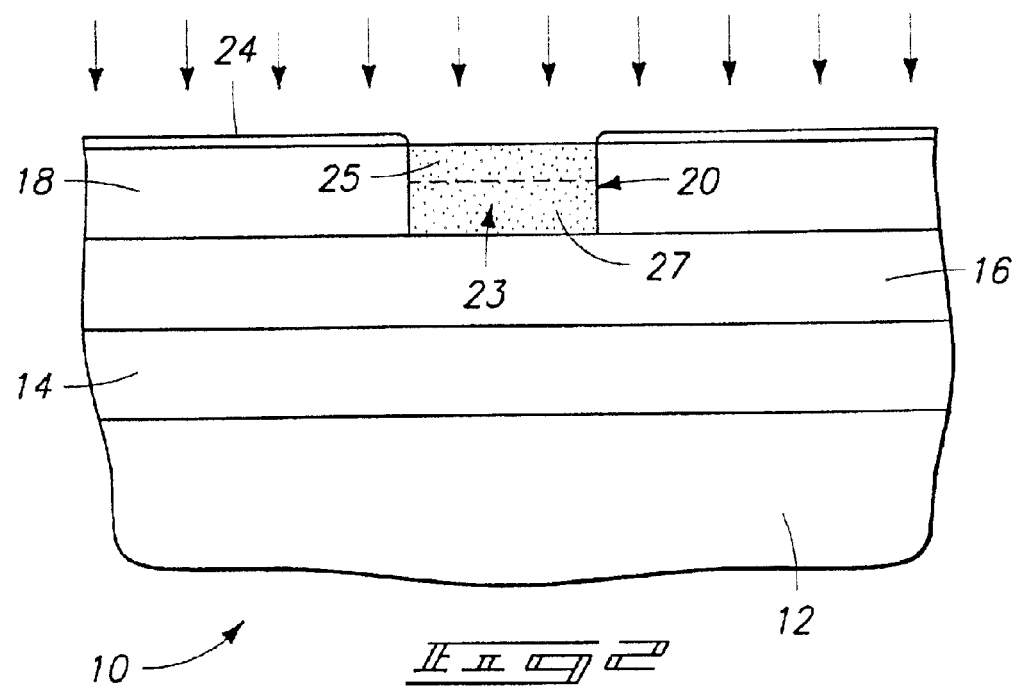

METHOD OF FORMING CHALCOGENIDE COMPRISING DEVICES, METHOD OF FORMING A PROGRAMMABLE MEMORY CELL OF MEMORY CIRCUITRY, AND A CHALCOGENIDE COMPRISING DEVICE

TECHNICAL FIELD

This invention relates to non-volatile resistance variable devices, to methods of forming a programmable memory cell of memory circuitry and to non-volatile resistance variable devices.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761,115; 5,896,312; 5,914,893; and 6,084,796, which ultimately resulted from U.S. patent application Ser. No. 08/652,706, filed on May 30, 1996, disclosing what is referred to as a programmable metallization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a structural change at a certain applied voltage. With such voltage applied, a single conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide having silver ions diffused therein. The present method of providing the silver ions within the germanium selenide material is to initially chemical vapor deposit the germanium selenide glass without any silver being received therein. A thin layer of silver is thereafter deposited upon the glass, for example by sputtering, physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material. This may form $Ag_2Se$, which effectively dopes the glass with silver.

Saturation of silver in germanium selenide is apparently at a maximum of about 34 atomic percent or less depending on the germanium selenide stoichiometry. Yet, preferred existing technology for cell fabrication constitutes a concentration which is less than the maximum; in the case of 34 atomic percent maximum, an example concentration would be about 27 atomic percent.

After the chalcogenide material is provided with silver to a desired concentration, the top electrode material (typically silver) is next deposited. But, as the silver doping/diffusion into the chalcogenide material approaches the maximum or saturation, some $Ag_2Se$ was discovered to form at the surface and remain there as opposed to diffusing into the glass. Further, the surface $Ag_2Se$ was typically in the form of semicircular nodules or bumps anywhere from 50 Angstroms to 20 microns across. Unfortunately when the typical silver electrode material is subsequently deposited, such tends to mound on top of these previous bumps. This can create voids to the doped germanium glass through the top electrode material, whereby the silver doped germanium selenide glass is partially exposed. Unfortunately, some of the photodeveloper solutions typically used for patterning the top electrode (i.e. tetramethyl ammonium hydroxide) will etch the glass that is exposed.

It would be desirable to overcome or at least reduce this problem. While the invention was principally motivated in overcoming this problem, it is in no way so limited. The artisan will appreciate applicability of the invention in other aspects unrelated to the problem, with the invention only being limited by the accompanying claims as literally worded and as appropriately interpreted in accordance with the doctrine of equivalents.

SUMMARY

The invention includes non-volatile resistance variable devices, methods of forming a programmable memory cell of memory circuitry and non-volatile resistance variable devices. In one implementation, a method of forming a non-volatile resistance variable device includes forming a first conductive electrode material on a substrate. An amorphous chalcogenide comprising material is formed to a first thickness over the first conductive electrode material. The chalcogenide material comprises $A_xB_y$, where "B" is selected from the group consisting of S, Se and Te and mixtures thereof, and where "A" comprises at least one element which is selected from Group 13, Group 14, Group 15, or Group 17 of the periodic table. A metal comprising layer is formed to a second thickness over the chalcogenide material. The metal comprising layer defines or has some metal comprising layer transition thickness for the first thickness of the chalcogenide comprising material such that when said transition thickness is met or exceeded, said metal comprising layer when diffused within said chalcogenide comprising material transforms said chalcogenide comprising material from an amorphous state to a crystalline state. Yet, the second thickness is less than but not within 10% of said transition thickness. The metal is irradiated effective to break a chalcogenide bond of the chalcogenide material at an interface of the metal and chalcogenide material and diffuse at least some of the metal into the chalcogenide material, and said chalcogenide comprising material remains amorphous after the irradiating. After the irradiating, a second conductive electrode material is deposited over the chalcogenide material, and which is continuous and completely covering at least over the chalcogenide material. The second conductive electrode material is formed into an electrode of the device.

In one implementation, a metal comprising layer is formed to a second thickness less than the first thickness over the chalcogenide comprising material. The metal is irradiated effective to break a chalcogenide bond of the chalcogenide material at an interface of the metal and chalcogenide comprising material and at least some of the metal is diffused into the chalcogenide comprising material, and said chalcogenide comprising material remains amorphous after the irradiating. The chalcogenide comprising material after the irradiating has a first region which is displaced from the interface at least by an interface region having a higher content of "A" than the first region. After the irradiating, a second electrode material is formed operatively proximate the chalcogenide material.

Other implementations and aspects are contemplated and disclosed.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

DETAILED DESCRIPTION OF THE PREFERRED EMBODIMENTS

Figure 3:
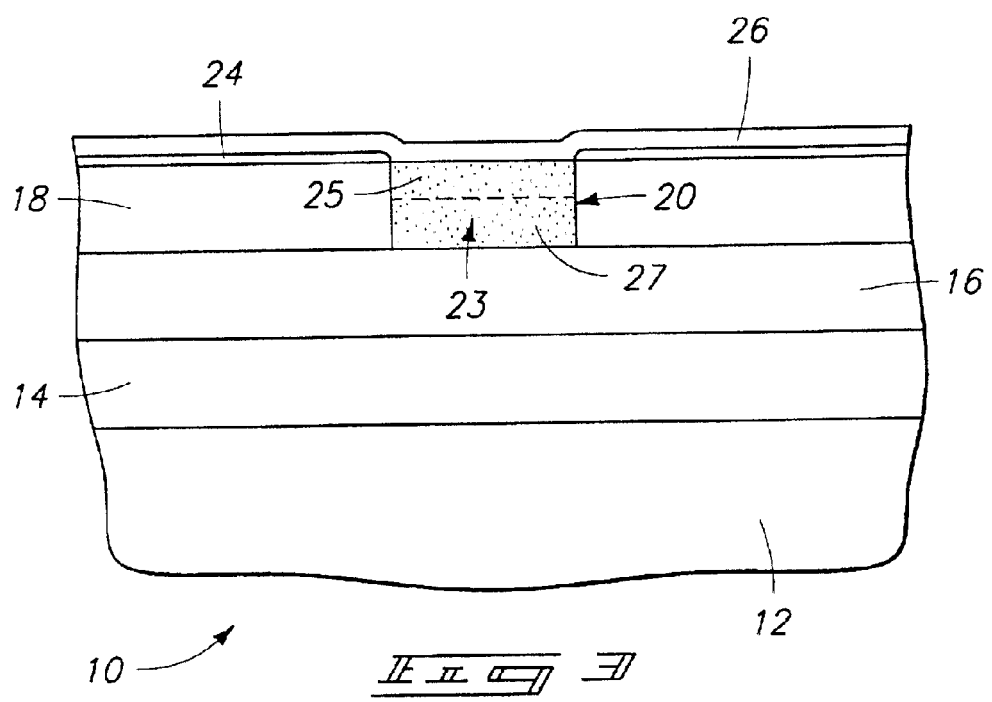
FIG. 3 is a view of the FIG. 1 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment 10 is shown in but one preferred embodiment of a method of forming a non-volatile resistance variable device. By way of example only, example such devices include programmable metallization cells and programmable optical elements of the patents referred to above, further by way of example only, including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance variable device" includes devices wherein a property or properties in addition to resistance is/are also varied. For example, and by way of example only, the device's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A first conductive electrode material 16 is formed over dielectric layer 14. By way of example only, preferred materials include any of those described in the incorporated Kozicki et al. patents referred to above in conjunction with the preferred type of device being fabricated. A dielectric layer 18 is formed over first electrode material 16. Silicon nitride is a preferred example.

An opening 20 is formed through layer 18 to conductive electrode layer 16. Such is filled with an amorphous chalcogenide comprising material 22 to a first thickness, which in this example is essentially defined by the thickness of layer 18. By way of example only, an exemplary first thickness range is from 100 Angstroms to 1000 Angstroms. The chalcogenide comprising material comprises $A_xB_y$, where "B" is selected from the group consisting of S, Se and Te and mixtures thereof, and where "A" comprises at least one element which is selected from Group 13 (B, Al, Ga, In, Tl), Group 14 (C, Si, Ge, Sn, Pb), Group 15 (N, P, As, Sb, Bi), or Group 17 (F, Cl, Br, I, At) of the periodic table. By way of example only, preferred elements for "A" are Ge and Si. An example preferred method of forming material 22 over substrate 10 is by chemical vapor deposition to completely fill opening 20, followed by a planarization technique, for example chemical mechanical polishing. Material 22 is preferably formed to be amorphous and remains amorphous in the finished device.

A metal comprising layer 24 is formed to a second thickness over chalcogenide material 22. Exemplary metals, by way of example only, include silver, zinc and copper. In one embodiment, the second thickness is less than but not within 10% of a "transition thickness". Specifically, the material of the metal comprising layer defines or has some transition thickness for a given thickness of the chalcogenide material such that when said material transition thickness is met or exceeded, the metal comprising layer when diffused within said chalcogenide comprising material transforms said chalcogenide comprising material from an amorphous state to a crystalline state. Such transition thickness can be different for different stoichiometry chalcogenide materials and for different metals. Further, the second thickness is below but not within 50% of the transition thickness in one preferred embodiment, not within 65% in another preferred embodiment, and not within 85% in yet another preferred embodiment.

For example, and by way of example only, a metal layer consisting essentially of elemental silver received over a 500 Angstrom germanium selenide glass having 25% atomic germanium and 75% atomic selenide has a transition thickness of 140 Angstroms. Accordingly in one preferred embodiment in such example, a metal layer 24 consisting essentially of elemental silver will have a thickness less than 124 Angstroms (i.e., not within 10%), in another embodiment a thickness less than 70 Angstroms (i.e., not within 50%), in another embodiment a thickness less than 49 Angstroms (i.e., not within 65%), and in another embodiment a thickness less than 21 Angstroms (i.e., not within 85%).

Referring to FIG. 2, metal 24 is irradiated effective to break a chalcogenide bond of the chalcogenide material at an interface of metal 24 and chalcogenide material 22, and diffuse at least some of metal 24 into chalcogenide material 22, with chalcogenide comprising material 22 remaining in the amorphous state after the irradiating. In FIG. 2, material 22 is designated with numeral 23 and peppered in the drawings to indicate metal ions being received therein. A preferred irradiating includes exposure to actinic radiation having a wavelength from about 164–904 nanometers, with radiation exposure at between 404–408 nanometers being a more specific example. A more specific example is a flood UV exposure tool operating at 4.5 milliwatts/cm$^2$ energy for 15 minutes in an oxygen-containing ambient at room temperature and pressure. A mechanism of incorporation might include $Ag_2Se$ formation at the chalcogenide surface/interface, and diffusion doping thereof into material 22.

All of material 24 received directly over chalcogenide comprising material 22 might be diffused to within such material as shown, or only some portion thereof might. The thickness of layer 24 is also chosen to be suitably thin to enable the impinging electromagnetic radiation to essentially transparently pass through material 24 to the interface of such material with chalcogenide material 22. The exemplary preferred thickness is as described above in comparison with the thickness of chalcogenide material 22, and is preferably less than or equal to 200 Angstroms.

The apparent linear thickness of layer 24 as a percentage of the linear thickness of chalcogenide material 22 effectively results in the same approximate metal incorporation in atomic percent within the chalcogenide material. In other words, a 2% to 20% thick metal layer compared to that of the underlying chalcogenide material will result in metal incorporation of an atomic percent of from about 2% to about 20% respectively. Accordingly as compared to conventional prior art, a lower atomic percent incorporation is conducted to within the chalcogenide material, and has been discovered in preferred embodiments to result in the elimination of surface agglomeration of $Ag_2Se$ which is understood to have principally caused the discontinuous subsequent electrode formation of the prior art. Thereby in the preferred embodiment, a continuous, void-free, complete covering of a subsequently deposited electrode layer was achieved in connection with deposition over at least chalcogenide material 23, as further described below.

In one exemplary embodiment, layer 24 of metal is formed to a second thickness over the chalcogenide material and the irradiating is effective to produce the chalcogenide material 23 (FIG. 2) to have an interface region 25 and a first region 23 which is displaced from the interface of the metal and chalcogenide material by interface region 25. In this exemplary embodiment, interface region 25 is characterized by a higher content of "A" of the $A_xB_y$ material as compared to the content of "A" in first region 23. Apparently, photodoping or other irradiation doping to the stated lower second thicknesses can result in greater driving of silver or other metal into germanium selenide or other glasses which can result in an outer germanium rich layer of the glass. This may facilitate a preferred lack of surface agglomeration of $Ag_2Se$.

Interface region 25 is preferably formed to have a thickness of less than or equal to 100 Angstroms. Further, such is preferably formed to have a thickness of at least 10 Angstroms. Further preferably, interface region 25 and first region 23 are formed to have substantially the same concentration of the diffused metal. Further preferably, interface region 25 and first region 23 are respectively homogenous.

Referring to FIG. 3, after the irradiating, a second conductive electrode material 26 is deposited over chalcogenide material 23. In the preferred embodiment, such second conductive electrode material is continuous and completely covers at least over chalcogenide material 23. An example preferred thickness range for second electrode material layer 26 is from 140 Angstroms to 200 Angstroms. The first and second conductive electrode materials might be the same material(s), or different material(s). By way of example only, preferred top and bottom electrode materials include silver, tungsten, platinum, nickel, carbon, chromium, molybdenum, aluminum, magnesium, copper, cobalt, palladium, vanadium, titanium, alloys thereof and compounds including one or more of these elements. In accordance with a preferred programmable metallization cell embodiment, and where "A" is Ge, at least one of materials 16 and 26 comprises silver. During formation of layer 26, some of it might diffuse into layer 23. Layer 26 and any remnant material 24 received directly over chalcogenide material 23 will constitute one electrode of the resistance variable device being fabricated, with layer 16 constituting another or second electrode for the device.

Figure 4:
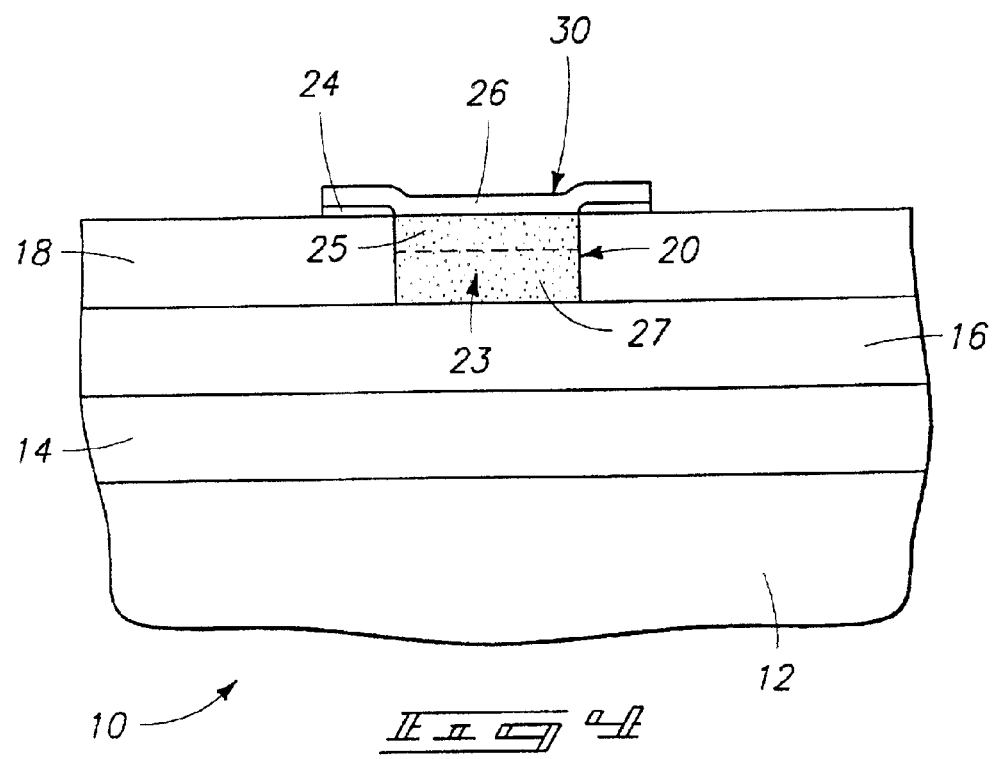
FIG. 4 is a view of the FIG. 1 wafer fragment at a processing step subsequent to that shown by FIG. 3.

Referring to FIG. 4, materials 24 and 26 are patterned into an electrode 30. Patterning to produce electrode 30 is typically and preferably conducted utilizing photolithography. Such provides but one preferred example of forming a second electrode material operatively proximate the chalcogenide material. In a preferred embodiment, such results in the formation of a non-volatile resistance variable device which is fabricated into a programmable memory cell of memory circuitry. In one preferred embodiment, the device is finally formed to have a concentration of metal in chalcogenide material 23 of less than 30% atomic in a lowest of a plurality of variable resistance states.

Figure 5:
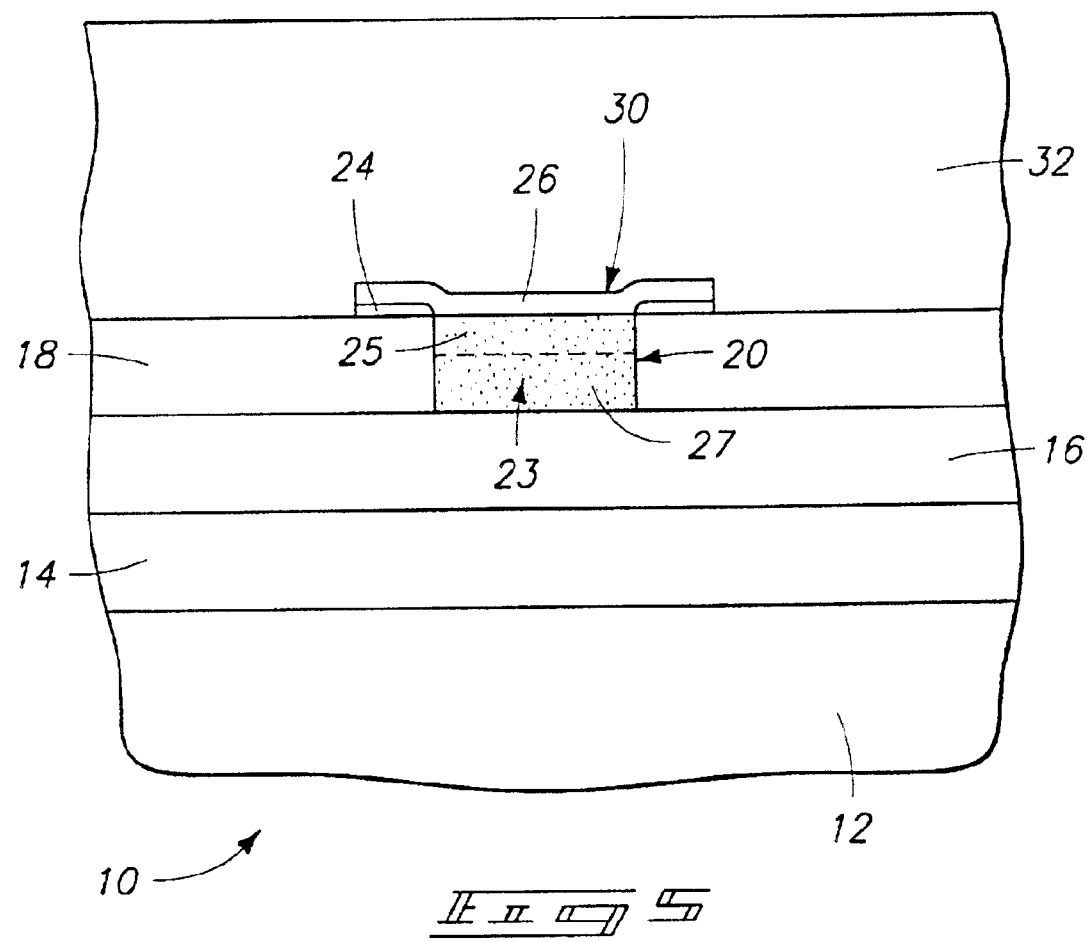
FIG. 5 is a view of the FIG. 1 wafer fragment at a processing step subsequent to that shown by FIG. 4.

Referring to FIG. 5, one or more dielectric layers 32 are ultimately formed over the device. Of course, intervening conductive and semiconductive layers might also be provided to form other lines and devices outwardly of the depicted device.

Independent of the method of fabrication, the invention comprises a non-volatile resistance variable device comprising some substrate having a first electrode formed thereover, for example electrode 16. A resistance variable chalcogenide material 23 having metal ions diffused therein is received operatively adjacent the first electrode. A second electrode, for example electrode 30, is received operatively adjacent the resistance variable chalcogenide material. The chalcogenide material comprises $A_xB_y$, where "B" is selected from the group consisting of S, Se and Te and mixtures thereof, and where "A" comprises at least one element which is selected from Group 13, Group 14, Group 15, or Group 17 of the periodic table.

The second electrode and resistance variable chalcogenide material operatively connect at an interface. The chalcogenide material has a first region 23 which is displaced from the interface at least by a chalcogenide material interface region 25 having a higher content of "A" than first region 23. Preferably and as shown, first region 23 extends to first electrode 16.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a chalcogenide comprising device, comprising:
    forming a first conductive electrode material on a substrate;
    forming an amorphous chalcogenide comprising material to a first thickness over the first conductive electrode material, the chalcogenide material comprising $A_xB_y$, where "B" is selected from the group consisting of S, Se and Te and mixtures thereof, and where "A" comprises at least one element which is selected from Group 13, Group 14, Group 15, or Group 17 of the periodic table;
    forming a metal comprising layer to a second thickness over the chalcogenide comprising material, said second thickness being less than, but not within 10% of a transition thickness of said metal comprising layer, said transition thickness being a thickness of said metal layer which, when diffused into said chalcogenide comprising material, transforms said chalcogenide comprising material from an amorphous to a crystalline state;
    irradiating said metal comprising layer such that at least some of the metal is diffused into the chalcogenide material; and
    forming a second conductive electrode over the chalcogenide comprising material.

2. The method of claim 1 wherein the irradiating is effective to form the chalcogenide material to have a first region which is displaced from the interface at least by an interface region having a higher content of "A" than the first region.

3. The method of claim 1 wherein "A" comprises Ge.

4. The method of claim 1 wherein "A" comprises Ge, and "B" comprises Se.

5. The method of claim 1 wherein "A" comprises Ge, "B" comprises Se, and the metal comprises Ag.

6. The method of claim 1 comprising forming the device into a programmable memory cell of memory circuitry.

7. The method of claim 1, wherein the second thickness is less than but not within 25% of the transition thickness.

8. The method of claim 1, wherein the second thickness is less than but not within 50% of the transition thickness.

9. The method of claim 1, wherein the second thickness is less than but not within 65% of the transition thickness.

10. The method of claim 1, wherein the second thickness is less than but not within 85% of the transition thickness.

11. The method of claim 1 wherein the first and second conductive electrode materials are different.

12. The method of claim 1 wherein the second electrode material predominately comprises elemental silver.

13. A method of forming a programmable memory cell of a memory circuitry, comprising:
    forming a first conductive electrode material on a substrate;
    forming an amorphous chalcogenide comprising material to a first thickness over the first conductive electrode material, the chalcogenide material comprising $A_xB_y$, where "B" is selected from the group consisting of S, Se and Te and mixtures thereof, and where "A" is selected from the group consisting of Ge, Si and mixtures thereof;
    forming a layer comprising Ag to a second thickness over the chalcogenide comprising material; said second thickness being less than, but not within 10% of a transition thickness of said Ag comprising layer, said transition thickness being a thickness of said Ag comprising layer which, when diffused into said chalcogenide comprising material, transforms said chalcogenide comprising material from an amorphous to a crystalline state;
    irradiating said Ag comprising layer such that at least some of the Ag is diffused into the chalcogenide material; and
    forming a second conductive electrode material over the chalcogenide material.

14. The method of claim 13 wherein the irradiating is effective to form the chalcogenide material to have a first region which is displaced from the interface at least by an interface region having a higher content of "A" than the first region.

15. The method of claim 13 wherein the second electrode material predominately comprises elemental silver.

16. A method of forming a chalcogenide comprising device, comprising:
    forming a first conductive electrode material on a substrate;
    forming an amorphous chalcogenide comprising material to a first thickness over the first conductive electrode material, the chalcogenide material comprising AxBy, where "B" is selected from the group consisting of S, Se and Te and mixtures thereof, and where "A" comprises at least one element which is selected from Group 13, Group 14, Group 15, or Group 17 of the periodic table;
    forming a metal comprising layer to a second thickness less than the first thickness over the chalcogenide comprising material, said second thickness being less than, but not within 50% of a transition thickness of said metal comprising layer, said transition thickness being a thickness of said metal layer which, when diffused into said chalcogenide comprising material, transforms said chalcogenide comprising material from an amorphous to a crystalline state;
    irradiating the metal effective to break a chalcogenide bond of the chalcogenide material at an interface of the metal and chalcogenide material and diffuse at least some of the metal into the chalcogenide comprising material, and said chalcogenide comprising material remaining amorphous after the irradiating, the chalcogenide comprising material after the irradiating having a first region which is displaced from the interface at least by an interface region having a higher content of "A" than the first region; and
    forming a second electrode material operatively proximate the chalcogenide material.

17. The method of claim 16 comprising forming the interface region to have a thickness of less than or equal to 100 Angstroms.

18. The method of claim 16 comprising forming the interface region to have a thickness of at least 10 Angstroms.

19. The method of claim 16 comprising forming the interface region to have a thickness of less than or equal to 100 Angstroms, and of at least 10 Angstroms.

20. The method of claim 16 comprising forming the second electrode material to be continuous and completely covering at least over the chalcogenide material.

21. The method of claim 16 comprising forming the interface region to be substantially homogenous.

22. The method of claim 16 comprising forming the interface region to not be substantially homogenous.

23. The method of claim 16 comprising forming the interface and first regions to have substantially the same concentration of the metal.

24. The method of claim 16 wherein the second electrode material predominately comprises elemental silver.

25. The method of claim 16, wherein said second thickness is less but not within 10% of said transition thickness.

26. A method of forming a programmable memory cell of memory circuitry, comprising:

forming a first conductive electrode material on a substrate;

forming an amorphous chalcogenide comprising material to a first thickness over the first conductive electrode material, the chalcogenide material comprising AxBy, where "B" is selected from the group consisting of S, Se and Te and mixtures thereof, and where "A" is selected from the group consisting of Ge, Si and mixtures thereof;

forming a layer comprising Ag to a second thickness less than the first thickness over the chalcogenide comprising material, said second thickness being less than, but not within 50% of a transition thickness of said metal comprising layer, said transition thickness being a thickness of said metal layer which, when diffused into said chalcogenide comprising material, transforms said chalcogenide comprising material from an amorphous to a crystalline state;

irradiating the metal effective to break a chalcogenide bond of the chalcogenide material at an interface of the metal and chalcogenide material and diffuse at least some of the metal into the chalcogenide comprising material, and said chalcogenide comprising material remaining amorphous after the irradiating, the chalcogenide comprising material after the irradiating having a first region which is displaced from the interface at least by an interface region having a higher content of "A" than the first region; and forming a second electrode material operatively proximate the chalcogenide material.

27. The method of claim 26 wherein the second electrode material predominately comprises elemental silver.

28. The method of claim 26, wherein said second thickness is less than but not within 10% of said transition thickness.

* * * * *

UNITED STATES PATENT AND TRADEMARK OFFICE
CERTIFICATE OF CORRECTION

PATENT NO. : 6,881,623 B2
DATED : April 19, 2005
INVENTOR(S) : Kristy A. Campbell et al.

It is certified that error appears in the above-identified patent and that said Letters Patent is hereby corrected as shown below:

Title page,
Item [56], References Cited, OTHER PUBLICATIONS, please correct the following:
"D.B. Johnson, et al., "Lateral Diffusion in Ag-Be Thin-Film Couples", Journal of Applied Physics, Vol. 40, No. 1, Jan. 1963, pp. 149-152" should read -- D.B. Johnson, et al., "Lateral Diffusion in Ag-Se Thin-Film Couples", Journal of Applied Physics, Vol. 40, No. 1, January 1969, pp. 149-152 --.
"U.S. Appl. No. 09/778,963, filed Feb. 8, 2001, Moore" should read -- U.S. Appl. No. 09/779,983, filed Feb. 8, 2001, Moore --.
The following two items should be inserted:
-- U.S. Appl. No. 10/077,867, filed Feb. 20, 2002, Campbell et al.
U.S. Appl. No. 10/232,757, filed Aug. 29, 2002, Li et al. --.

Please correct the following:
"Hirose, at al., "High Memory Behavior and Reliability in Amorphous $As_1S_0$ Film Doped with Ag", Jul. 17, 1980, pp. K187-K190" should read -- Hirose, et al., "High Speed Memory Behavior and Reliability of an Amorphous $As_2S_3$ Film Doped with Ag", Jul. 17, 1980, pp. K187-K190 --.

"Hirose, et al., "Polarity-dependent memory switching and behavior of Ag dendrite in Ag-photodoped amorphous $As_1B_1$ films", Journal of Applied Physics, vol. 47, No. 6, Jun. 1976, pp. 2787-2772" should read -- Hirose, et al., "Polarity-dependent memory switching and behavior of Ag dendrite in Ag-photodoped amorphous $As_2S_3$ films", Journal of applied Physics, Vol. 47, No. 6. Jun. 1976, pp. 2767-2772 --.

"Kluge, et al., "Silver photodifusion in amorphous $Ga_1Se_1$", Journal of Non-Crystalline Solids 124 (1990) pp. 180-183" should read -- Kluge, et al., "Silver photodiffusion in amorphous $Ge_xSe_{100x}$", Journal of Non-Crystalline Solids 124 (1990) pp. 186.193 --.

"Aron Technologies Corporation, Technology Description: *Programmable Metallization Cell (PMC)*, (pre-Jul. 7, 2000) pp. 1-5" should read -- Axon Technologies Corporation, Technology Description: *Programmable Metallization Cell (PMC)*, (pre-Jul. 7, 2000) pp. 1-6 --.

"Huggett et al., *Development of silver sensitized germanium selenide photoresist by reactive sputter etching in SF*, 42 Appl. Phys. Lett., No. 7, pp. 592-594 (Apr. 1983)" should read -- Huggett et al., *Development of silver sensitized germanium selenide photoresist by reactive sputter etching in $SF_6$*, 42 Appl. Phys. Lett., No. 7, pp. 592-594 (Apr. 1983) --.

UNITED STATES PATENT AND TRADEMARK OFFICE
CERTIFICATE OF CORRECTION

PATENT NO. : 6,881,623 B2
DATED : April 19, 2005
INVENTOR(S) : Kristy A. Campbell et al.

It is certified that error appears in the above-identified patent and that said Letters Patent is hereby corrected as shown below:

Title page (cont'd),
please correct the following:
"West et al., *Equivalent Circuit Modeling of the* $Ag|As_{0-24}S_{0.24}Ag_{\alpha 40}|Ag$ *System Prepared by Photodissolution of Ag*, 145 J. Electrochem. Soc., No. 9, pp. 2971-2974 (Sep. 1998)" should read -- West et at., *Equivalent Circuit Modeling of the* $Ag|As_{0.24}S_{0.24}Ag_{\alpha 40}|Ag$ *System Prepared by Photodissolution of Ag*, 145 J. Electrochem. Soc., No. 9, pp. 2971-2974 (Sep. 1998) --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO.    : 6,881,623 B2
DATED         : April 19, 2005
INVENTOR(S)   : Kristy A. Campbell et al.

It is certified that error appears in the above-identified patent and that said Letters Patent is hereby corrected as shown below:

Title page,
Item [56], References Cited, OTHER PUBLICATIONS, please correct the following:
"Kluge, et al., "Silver photodifusion in amorphous $Ga_1Se_1$", Journal of Non-Crystalline Solids 124 (1990) pp. 180-183" should read -- Kluge, et al., "Silver photodiffusion in amorphous $Ge_xSe_{100-x}$", Journal of Non-Crystalline Solids 124 (1990) pp. 186-193 --; and "West et al., *Equivalent Circuit Modeling of the Ag|As$_{0-24}$S$_{0.24}$Ag$_{a40}$|Ag System Prepared by Photodissolution of Ag,* 145 J. Electrochem. Soc., No. 9, pp. 2971-2974 (Sep. 1998)" should read -- West et al., *Equivalent Circuit Modeling of the Ag|As$_{0.24}$S$_{0.36}$Ag$_{a40}$|Ag System Prepared by Photodissolution of Ag,* 145 J. Electrochem. Soc., No. 9, pp. 2971-2974 (Sep. 1998) --.

Signed and Sealed this

Sixth Day of September, 2005

JON W. DUDAS
*Director of the United States Patent and Trademark Office*